(12) United States Patent
Fransson et al.

(10) Patent No.: US 8,379,017 B2
(45) Date of Patent: Feb. 19, 2013

(54) METHOD FOR IMPROVING THE PERFORMANCE IN PROCESSING AN INTERPROCESS DIGITAL MOCKUP

(75) Inventors: Henrik Fransson, Hamburg (DE); Stephane Griffig, Hamburg (DE)

(73) Assignee: Airbus Operations GmbH (DE)

( * ) Notice: Subject to any disclaimer, the term of this patent is extended or adjusted under 35 U.S.C. 154(b) by 864 days.

(21) Appl. No.: 12/227,198

(22) PCT Filed: May 9, 2007

(86) PCT No.: PCT/EP2007/004114
§ 371 (c)(1), (2), (4) Date: Jun. 16, 2009

(87) PCT Pub. No.: WO2007/128580
PCT Pub. Date: Nov. 15, 2007

(65) Prior Publication Data
US 2010/0053155 A1    Mar. 4, 2010

Related U.S. Application Data

(60) Provisional application No. 60/746,830, filed on May 9, 2006.

(30) Foreign Application Priority Data

May 9, 2006    (DE) .......................... 10 2006 021 574

(51) Int. Cl.
*G06T 17/00* (2006.01)
(52) U.S. Cl. ........................ 345/420; 505/419
(58) Field of Classification Search .................. None
See application file for complete search history.

(56) References Cited

U.S. PATENT DOCUMENTS

| | | | | |
|---|---|---|---|---|
| 6,138,121 A | * | 10/2000 | Costa et al. | 1/1 |
| 6,625,718 B1 | * | 9/2003 | Steiner | 711/220 |
| 7,337,167 B2 | * | 2/2008 | Muras | 1/1 |
| 7,363,230 B2 | * | 4/2008 | Matsunuma | 704/500 |
| 2004/0083480 A1 | * | 4/2004 | Dodge | 719/310 |
| 2004/0177319 A1 | * | 9/2004 | Horn | 715/501.1 |
| 2004/0199523 A1 | * | 10/2004 | Sako et al. | 707/100 |
| 2005/0233290 A1 | * | 10/2005 | Jackson | 434/262 |
| 2006/0050073 A1 | * | 3/2006 | Kanai et al. | 345/423 |
| 2007/0038947 A1 | * | 2/2007 | Brandl et al. | 715/762 |

FOREIGN PATENT DOCUMENTS

| | | |
|---|---|---|
| DE | 10065820 | 7/2001 |
| DE | 10356682 | 7/2005 |
| DE | 102005011615 | 12/2005 |

(Continued)

OTHER PUBLICATIONS

Usage Guide for the STEP PDM Schema V 1.2 (Release 4.3, Jan. 2002).*

(Continued)

*Primary Examiner* — Daniel Washburn
*Assistant Examiner* — Kyle Zhai
(74) *Attorney, Agent, or Firm* — Lerner, David, Littenberg, Krumholz & Mentlik, LLP

(57) ABSTRACT

A method for improving the performance in developing an interprocess digital mockup. Product data elements are compiled from a digital mockup, wherein the product data elements contain geometry data elements and meta data elements. The geometry data elements are addressed and assigned to a geometry structure. The meta data elements are addressed and assigned to a meta structure. The geometry structure and the meta structure are subsequently linked by a communication protocol such that bidirectional interaction between the geometry structure and the meta structure is realized.

17 Claims, 2 Drawing Sheets

FOREIGN PATENT DOCUMENTS

| | | |
|---|---|---|
| JP | 09-050459 A | 2/1997 |
| JP | 2003-316834 A | 11/2003 |
| JP | 2005107870 A | 4/2005 |
| JP | 2005327170 A | 11/2005 |
| RU | 2223544 C1 | 2/2004 |
| SU | 1464168 A1 | 3/1989 |

OTHER PUBLICATIONS

Delacour. "Presentation of the first PLM integrated optical simulation software for the desig and engineering of optical systems", proceedings of the SPIE, SPIE, Bellingham, VA, US, vol. 5249, 2004, 42-53.

Cimdata: "Teamcenter Express", Dec. 2005, Cimdata, pp. 1-16.

Ungerer, Buchanan: "Usage guide for the step PDM Schema V1.2", Jan. 2002, PDM Implementator Forum.

Baumann: "Structure oriented exchange of product model data" 2000, TU Berlin.

Kindrick: "Step PM data exchange", Jun. 12, 2000, PDM Implementor Forum.

Kriegel.: "Spatial data management for virtual product development", Computer Science in Perspective, Assays dedicated to Thomas Ottmann Springer Verlag Berlin, Germany, 2003, pp. 216-230.

Open product lifecycle data sharing using XML, 2002.

* cited by examiner

METHOD FOR IMPROVING THE PERFORMANCE IN PROCESSING AN INTERPROCESS DIGITAL MOCKUP

REFERENCE TO RELATED APPLICATION

This application claims the benefit of the filing date of German Patent Application No. 10 2006 021 574.5 filed May 9, 2006 and of U.S. Provisional Patent Application No. 60/746,830 filed May 9, 2006, the disclosures of which applications are hereby incorporated herein by reference.

FIELD OF THE INVENTION

The present invention relates to a method, a device, a machine-readable storage medium and a program element for improving the performance in processing an interprocess digital mockup.

TECHNOLOGICAL BACKGROUND

In modern product development, a product is nowadays developed as well as managed and modified over the entire product life cycle with a digital mockup. Such a digital mockup (DMU) has a product structure of the product that consists of modules, individual components and their geometry in correct positional arrangement. The purpose of the digital mockup consists of replacing the physical mockup (PMU) and of making available different views and functions of the product. For example, studies such as installation and removal studies, collision tests, simulations and buildability tests may be carried out on the basis of the digital mockup. The digital mockup also makes it possible to improve the time and cost pressure as well as the management of a diversity of variations with respect to coordination, analysis and concretizing of development results.

A digital mockup may represent a realistic description of a product. It consists of document attributes and structures, for example, tree structures that reflect the product structure, and therefore comprises a unique data set that refers to a certain end product (e.g., vehicle or aircraft).

Consequently, a digital mockup is able to illustrate the product in the form of a 3-D illustration, for example, on a computer platform. The departments involved over the product life cycle, for example, development or servicing, may access the digital mockup in order to retrieve information or incorporate changes.

However, it is extremely difficult to make available a high-performance digital mockup with a large number of components and product structures for larger product structures, for example, in the aircraft industry.

SUMMARY OF THE INVENTION

Among other things, it may be an object of the present invention to improve the performance in illustrating and processing an interprocess digital mockup.

This objective may be solved by a method, a machine-readable storage medium as well as a program element for improving the performance in processing an interprocess digital mockup with the characteristics of the independent claims.

According to one exemplary embodiment of the invention, a method is made available for improving the performance in processing an interprocess digital mockup. According to this embodiment, the product data elements are selected from a digital mockup (DMU) and compiled. The product data comprises geometry data elements and meta data elements. The geometry data elements are subsequently assigned and addressed to a geometry structure and the meta data elements are assigned and addressed to a meta structure. The geometry structure and the meta structure are linked with a communication protocol such that bidirectional interaction between the geometry structure and the meta structure is realized by the communication protocol.

According to another exemplary embodiment, a device is made available for improving the performance in processing an interprocess digital mockup. The device for improving the performance in processing an interprocess digital mockup features at least one processor that is realized such that the above-described steps of the method may be carried out.

Another exemplary embodiment makes available a machine-readable storage medium, in which a program for improving the performance in processing an interprocess digital mockup is stored, wherein said program carries out the above-described steps of the method when it is executed by a processor.

According to another exemplary embodiment, a program element is made available for improving the performance in processing an interprocess digital mockup, wherein the program element carries out the above-described steps of the method when it is executed by a processor.

The invention may therefore be realized by a computer program, i.e., a software, as well as by one or more special electric circuits, i.e., in hardware, or in any hybrid form, i.e., by software components and hardware components.

The term product data element describes a data element that features all information on a component of a product. This means that all properties and attributes of a component are contained in a program data element. The properties of a product data element may be divided into geometry data elements and meta data elements. Geometry data elements comprise all data required for the spatial definition of the component, as well as its position in space. This data may consist, for example, of positional data, contour data, geometry data, location data and other data required for the visualization. Meta data comprises the other information on a component of a product. Meta data may consist, for example, of version data, time data, component number data, development status data, stock outage data, delivery data, etc.

The terms data structure and geometry structure or meta structure respectively refer to a data directory, in which information and data elements are clearly arranged in the form of a list that is organized in accordance with certain structures. Indices, attributes and symbolic links associated with the data elements are also made available in such a structure.

The data structures respectively the geometry structure as well as the meta structure may be structured in a certain arrangement and have addresses at different locations that respectively correspond to an address of the data element or the product data element, respectively. In other words, the data elements are addressed in the data structure. When the data directories or the data structure are/is restructured, it is merely required to change, shift, delete or add addresses, but not the physical storage location of the data element. The addressing simultaneously makes it possible to access the data element in the data structure and to physically change and modify the data element such that, for example, positional data, dimensions or the quantity, in other words the meta data or the geometry data, is changed.

In modern industrial enterprises, for example in the aircraft industry, the product structures or the number of product components exceed(s) 30,000 parts and the product structures may comprise more than 1.2 gigabytes. The processing or visualization of such a digital mockup is no longer possible on conventional systems. The aircraft industry, for example the firm Airbus, requires such a capacity that at least 1.4 million instances may be processed over a depth of 50 layers. The number of parts linked and addressed to the instances amounts to more than 400,000 links. One approach used so far consists of neglecting and deleting irrelevant information such that only the parts and structures selected by the user are displayed, for example, on a visualizing tool. Information on the not-shown structures or the structures to be neglected may not be subsequently retrieved from the visualizing tool. In addition, the comprehensive overview of the entire product model is lost. Another approach to solving the capacity problem consists of separating the visualization data from the product data and the meta data such that the required performance is reduced. However, this also may cause important information to be lost because it is necessary, for example, to simultaneously know the version numbers, component numbers or other meta information in order to process the geometry data.

In the present invention, the product data elements are separated into geometry data elements and meta data elements. The geometry data elements are addressed with an address and assigned to a geometry structure. Analogously, the meta data elements are addressed and assigned to a meta structure. In order to still retrieve the entire information content of the geometry structure or the meta structure, a communication protocol links the geometry structure and the meta structure in order to thusly realize bidirectional interaction on the basis of the assigned addresses, mutual information retrieval and modifications. This means that the geometry structure may be visualized and processed without involving the meta structure or the meta data such that the performance may be improved. Nevertheless, the geometry structure interacts with the meta structure by the communication protocol such that it is still possible to retrieve all information. The present invention makes it possible to condition the data in such a way that bidirectional communication and parallel data-processing may be realized. This may make it possible to improve the performance and to simultaneously retrieve all information.

In another exemplary embodiment, the meta structure may be illustrated and processed in a browser. For example, a certain component structure or meta structure may be illustrated and all meta data may be displayed to the user. The user may simultaneously choose and select the components and the respective layers. Subsequently, the geometry data of the selected components or data may be accessed by the communication protocol and processed or visualized. This means that all information is preserved in its entirety despite the structure separation.

According to another exemplary embodiment, the geometry structure is illustrated and processed in an image processing device. For example, a wing element of an aircraft may be selected in the geometry structure and illustrated and processed in an image processing device. If the user requires additional information that is not contained in the geometry structure, the communication protocol enables the user to establish a link between the geometry structure and the meta structure and therefore to retrieve information such as, for example, the number of parts in the storage facility, etc. This means that all information is preserved in its entirety despite the structure separation.

According to another exemplary embodiment of the method, the geometry data elements are also addressed in the meta structure such that the product data elements are addressed and assigned in the meta structure. In this case, the meta structure comprises the addressing and the dictionary structure of the entire digital mockup such that any and all structures may be selected at this location. This selection may be forwarded to the geometry structure, for example, by the communication protocol and then illustrated and processed in an image processing device.

In another exemplary embodiment of the method, the meta structure and the geometry structure have a tree structure. This may make it possible, for example, to illustrate the product structure or a component list in a structured fashion such that a comprehensive overview of the components or product elements used is provided. In another exemplary embodiment, the tree structure represents a product structure of the digital mockup. Product structures are usually illustrated in the form of a tree structure, wherein the structure elements are organized in a hierarchic fashion. The hierarchy describes a system of elements that are mutually superordinate or subordinate. In a stricter sense (monohierarchy or tree structure), no more than one other element is directly superordinate to each element, wherein several superordinate elements are possible in a polyhierarchy. With respect to mathematical considerations, a hierarchy requires an order relation that defines a tree (monohierarchy) or a directional acyclic graph (polyhierarchy). The categorization (classification) or separation (division) of objects in a hierarchy frequently implies a significance that is already contained in the hierarchy, according to which the objects are structured.

In another exemplary embodiment, a universally unique identification number is assigned to each product data element such that the geometry data elements and the meta data elements of a product element have the same identification number and an unambiguous communication may take place. This may enable the communication protocol to identify the meta data elements and the geography data elements in the respective structures and to realize bidirectional interaction.

In another exemplary embodiment, the identification number additionally contains addressing information, namely a so-called index of the positions of the product data elements in the meta structure and the geometry structure. Due to this additional addressing information on the position of the product element, it may be possible to exactly assign the addressing information to the product data elements in a structure, for example, a tree-structure. Addressing information may consist, for example, of information on the layer number or an instance of this structure. It is also possible to position a component, for example, with the same geometry data several times in the meta structure or the geometry structure by the additional addressing information, wherein the component data of the component is only physically stored once. For example, if the component consists of a screw, the geometric shape may be stored in a production data element and the component may be assigned a special component number. Such a screw may be installed, for example, one-thousand times such that addressing information is also added to the identification number and a universally unique identification number (so-called UUID) is created. When working, for example, in the geometry structure such as in a three-dimensional construction program, the geometry data elements of this screw are only loaded in the form of physical data once although the screw is used several times in the geometry structure. This may reduce the required data volume.

In another exemplary embodiment, another identification number is changed if one of the elements of the meta data elements and the geometry data elements is added. A modification of the meta data elements or the geometry data elements such as, for example, changing the dimensions of a screw may result in a change of the identification number such that another unique identification number is created in order to prevent a version conflict. The modification makes it possible to also change meta data elements. Consequently, the version number or other meta information may be changed if a component is modified.

In another exemplary embodiment, the address information of the corresponding identification number is changed if one of the elements of the meta data elements or the geometry data elements is added. For example, if an element is merely shifted, installed or removed without changing the geometry, the identification number may remain the same, in which case only the address information is changed. This may make it possible to prevent a physical duplication of the data elements.

The geometry data elements may be selected, for example, from positional data, geometric data, Catia-data, geometric dimensions, DMU-data files, Pro-Engineer data and CAD-data.

In another exemplary embodiment, the meta data elements may be selected from the group consisting of time data, version data, development status data, component number data, positional data, geometric data, geometric dimensions, DMU-data files, Catia-data, Pro-Engineer data and CAD-data.

According to another exemplary embodiment, the meta structure and the geometry structure may be divided over a multitude of processors. Resources may be better utilized if the meta data structure and the geometry data structure are realized on different systems such as, for example, on different processors.

In the another exemplary embodiment, processes are essentially carried out simultaneously in a multitude of processors. If the structures are realized, for example, on different systems, the structures may be processed or illustrated simultaneously (multitasking).

The embodiments of the method also apply to the device, the machine-readable storage medium and the program element and vice versa.

BRIEF DESCRIPTION OF THE DRAWINGS

The present embodiments are described in greater detail below with reference to the drawings in order to further elucidate and better understand the invention. In these drawings.

Identical or similar components are identified by the same reference symbols in the different figures. The figures are illustrated schematically and not drawn true-to-scale.

DETAILED DESCRIPTION OF THE EXEMPLARY EMBODIMENTS

Figure 1:
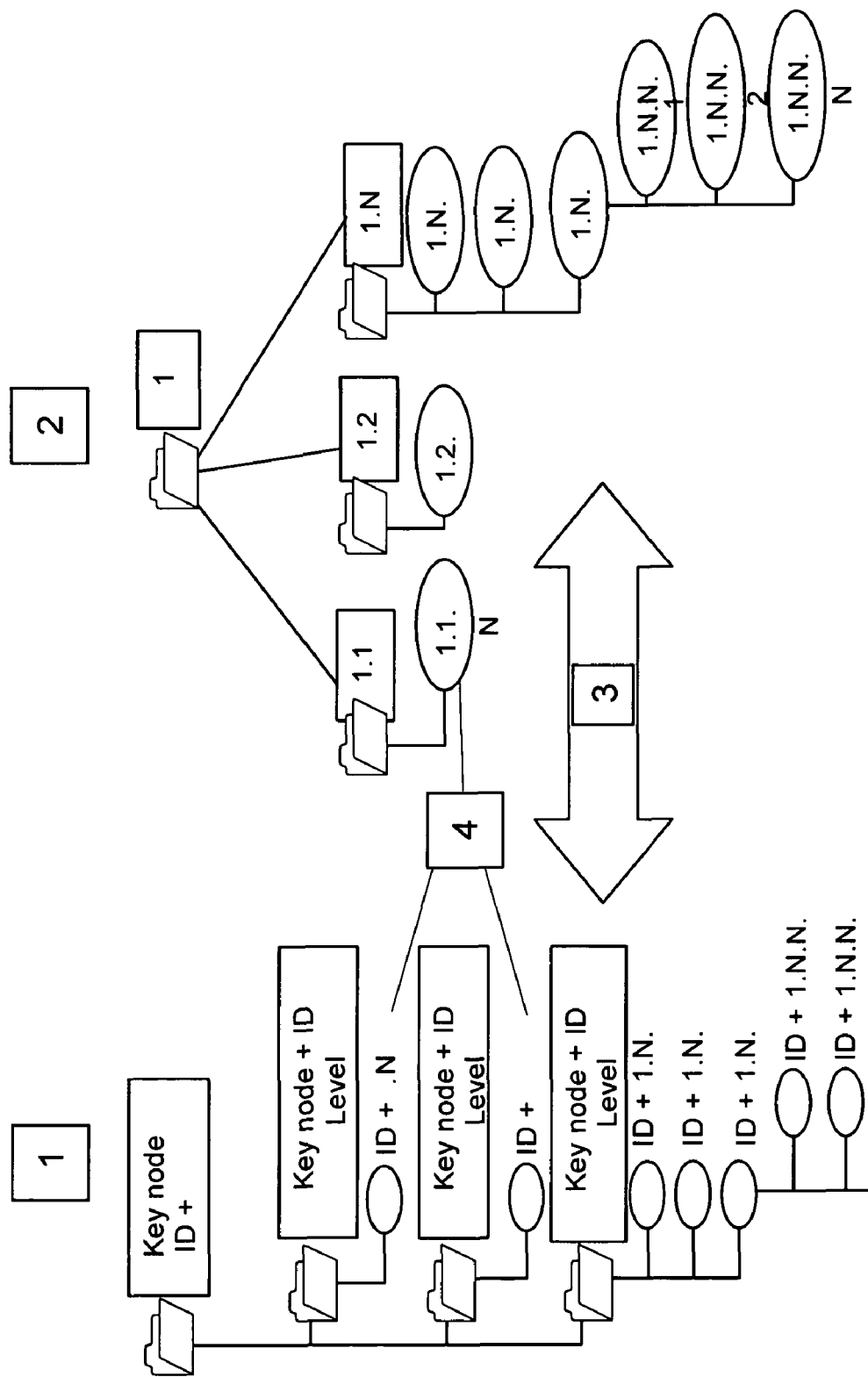
FIG. 1 shows an illustration of the separation between the meta structure and the geometry structure according to an exemplary embodiment of the invention.

The method is schematically illustrated in FIG. 1 in the form of a meta structure 1 and a geometry structure 2. According to the method for improving the performance in processing an interprocess digital mockup, a product data element is initially separated into geometry data elements and meta data elements. The geometry data elements are assigned and addressed to the geometry structure 2 and the meta data elements are assigned and addressed to the meta structure 1. The two structures, i.e., the geometry structure and the meta structure, are linked by a communication protocol 3 such that bidirectional interaction between the geometry structure 2 and the meta structure 1 may be realized with the aid of the communication protocol 3.

In order to improve the performance, the method separates the meta data information and the geometry data information of the product data elements as shown in FIG. 1. The addition of a unique identification number to each node 4 of the structures 2, 3 makes it possible to enter changes and modifications of the product structure as well as modifications and changes of the linked geometry data element. In this case, the geometry in the geometry structure 2 is combined, e.g., a reduced depth of the structure is realized in the tree structure (index tree), i.e., the graduation of the tree structure is reduced (see FIG. 1). The identification number of the product data elements or the nodes 4 also contains addressing information in order to assign each component or data element to a different position in the meta structure 1 or the geometry structure 2. The performance may be additionally improved by also combining the combined geometry, for example, in three different layers that may be exchanged "on the fly."

The communication protocol 3 is used for ensuring the exchange of information between the meta data and the geometry data or between the meta structure 1 and the geometry structure 2, respectively. Within the protocol 3, the generated index key or the generated identification number of the data set is used in order to identify the identification of each part within the geometry structure and the meta structure or vice versa.

In addition, the present invention allows multiprocessing. Due to the separation of the meta data and the geometry data in the dataset and the bidirectional communication between the two information sources or between the meta structure 1 and the geometry structure 2 realized by the communication protocol, one or more processors may be used for processing the individual tasks such that the performance is improved.

Figure 2:
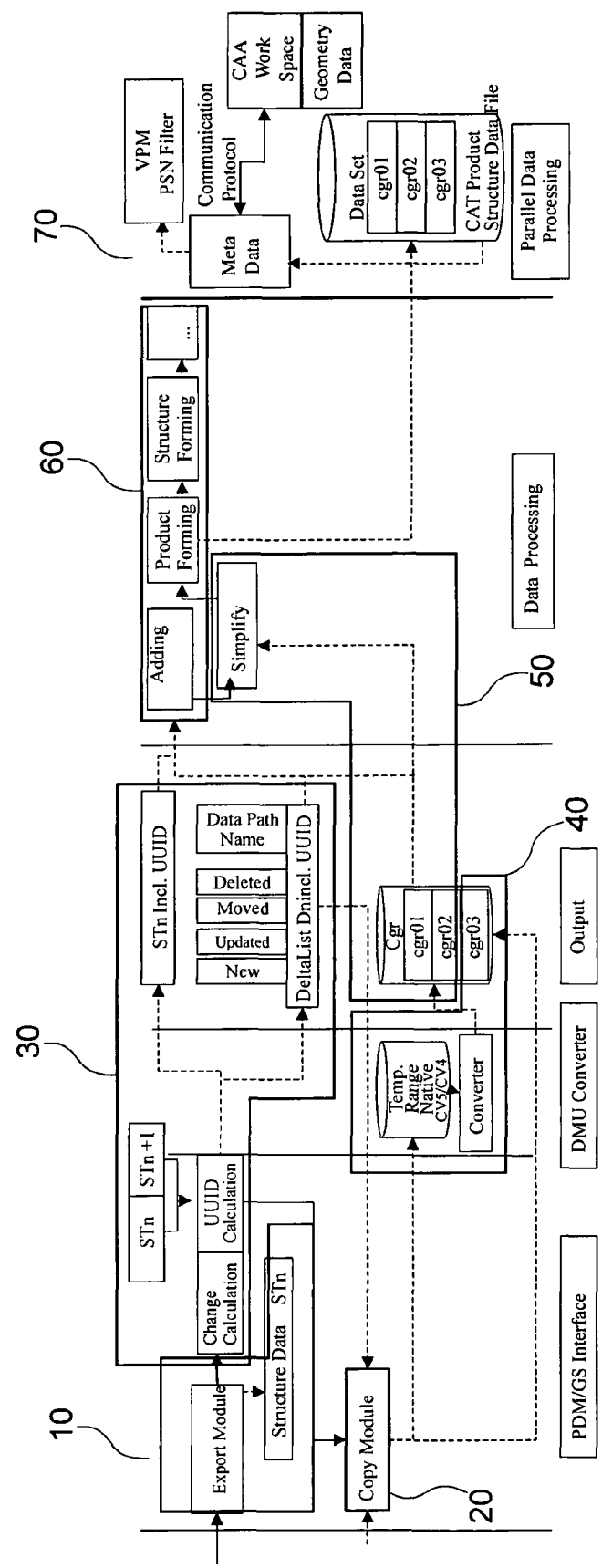
FIG. 2 shows an illustration of the work flow according to an exemplary embodiment of the invention.

FIG. 2 shows an exemplary flowchart for making available and conditioning the meta data elements and the geometry data elements. Complete or partially extracted product data elements of modules of a mockup are imported in dependence on a product data management system (PDM, VPM (Virtual Product Management)) or a Geometry Service System (GS). In step 10, a database structure of the product data elements of a mockup including its meta data elements is made available. The meta data elements comprise, for example, information on attributes of a product data element such as the version number or inventory. The product structure of the product development is predominantly realized in a hierarchic fashion in a tree structure. For example, a module fuselage segment of an aircraft is situated in an upper layer and the individual components such as everything from the interior equipment to the individual screws is situated in the dependent sublayers.

In step 20, the geometry data elements of the product structure of a mockup are made available, namely in accordance with the product structure of step 10. For this purpose, all geometry data elements, for example, of the fuselage segment that are required for illustrating and geometrically processing the product data element, for example, the fuselage segment, on a visualizing tool are imported. These geometry data elements may consist of so-called native geometry data elements. Native product data comprises all geometric attributes including all geometric and mathematical dependencies. These native geometry data elements may originate from a database repository, i.e., from a database of a construction tool such as, for example, Catia V4 or V5.

In step 30, a universally unique address (UUID) is initially calculated and assigned to each product data element including the product data elements of the substructures. In order to ensure that the product data element may be positively identified, the UUID of the product data element does not change, namely even if the meta data elements or the geometry data elements of the product data element are modified. A new UUID is only assigned to this product data element if a new product data element is inserted. The exemplary fuselage segment imported above has a universally unique identification number (UUID). Analogously, the subassemblies such as, for example, the individual screws also have their own UUID.

In step 40, the geometry data elements are processed in that all information that does not serve for visualizing the product data element is filtered out. This may be advantageous because the geometric and mathematical dependencies represent an extremely high processing expenditure in complex product structures with many sublayers. This is the reason why the native geometry data elements are filtered out in such a way, for example, that all mathematical data that is not required for the visualization is filtered out. This may result in a visualization format of the geometry data elements, in which the geometry data elements of the product data element may be visualized in the form of a 3-dimensional triangular illustration.

In step 50, the geometry data elements in the DMU format may be further simplified, for example, by changing the resolution of the triangles of the 3-dimensional triangular illustration.

In step 60, the tree structure of the imported product data element may also be simplified. For example, all sublayers of a product structure that should not be illustrated may be filtered out. The identification numbers are assigned on the basis of the product structure of the product data element. The identification number is also referred to as the communication identification number and consists of the UUID of the product data element and an index. The UUID was already assigned to the imported product data element, for example the fuselage segment, in step 30. The corresponding subassemblies that also have a UUID contain a so-called index that defines the position of these subassemblies of the product element in the product structure of the imported product data element.

In step 70, the thusly structured product data elements are subsequently filed in a data set. This data set contains all meta data elements and geometry data elements of the product element. All components of the product data element are now assigned due to the definite assignment of the product data elements or the meta data elements and the geography data elements and the identification number that consists of a universal UUID and the index.

A meta structure 1 and a geometry structure 2 are now created in accordance with the product structure of the product data element. Both identification numbers are stored in the meta structure 1 and the geometry structure 2 in accordance with the product structure. The meta data structure is able to retrieve the meta data elements of a product data element and the geometry structure is able to retrieve the geometry data elements of the product data element from the data set by the universally unique identification numbers. The communication protocol 3 therefore is able to realize bidirectional communication between the meta structure 1 and the geometry structure 2 with the aid of the unique identification number.

For example, if a product data element is selected in the visualization tool, the user only sees the information required for the visualization. However, the communication protocol selects the product data element with the same identification number in the meta structure such that the additional meta information may be displayed separately. Since the meta data information and the geometry data element are made available separately, the respective applications, for example, a browser for processing the meta data and a visualizing tool for processing the geometry data elements, are not mutually influenced such that the respective tasks may be executed faster and with fewer capacities.

The solution therefore significantly improves the work on the digital mockup and the work over the entire product life cycle, for example, because the work processes may be improved, supported and coordinated. For example, it is possible to realize Design-in-Context that improves the Design-Review, Clash-Visualization, Design to Assemble, Assemble Sequence Planning, Shop Floor Visualization, Supplier-Integration, Technical Documentation and Servicing.

It should also be noted that "comprising" does not exclude any other elements or steps and "a" or "an" does not exclude a multitude. It should furthermore be noted that characteristics or steps that were described with reference to one of the above-discussed embodiments may also be used in combination with other characteristics or steps of other above-discussed embodiments. The reference symbols in the claims should not be interpreted in a restrictive sense.

What is claimed is:

1. A method for improving the performance in processing an interprocess digital mockup, wherein said method comprises:
    importing a plurality of product data elements of a digital mockup;
    wherein each of the plurality of product data elements comprises at least one geometry data element and at least one meta data element;
    addressing and assigning each of the geometry data elements to a geometry structure, wherein a geometry in the geometry structure is combined such that a graduation of the geometry structure is reduced;
    addressing and assigning each of the meta data elements to a meta structure;
    addressing each of the geometry data elements also in the meta structure such that each of the plurality of product data elements is addressed and assigned in the meta structure;
    wherein each product data element has a universally unique identification number such that each of the at least one geometry data element and the corresponding at least one meta data element of a product data element have the same universally unique identification number for providing a definite communication;
    linking the geometry structure and the meta structure by a communication protocol such that bidirectional interaction between the geometry structure and the meta structure is realized;
    selecting one of the geometry data elements in the meta structure;
    forwarding the selection to the geometry structure by the communication protocol; and
    illustrating and processing the selected geometry data element in an image processing device.

2. The method of claim 1, further comprising:
    illustrating and processing the meta structure in a browser.

3. The method of claim 1, further comprising:
    illustrating and processing the geometry structure in an image processing unit.

4. The method of claim 1,
    wherein the meta structure and the geometry structure have a tree structure.

5. The method of claim 4,
wherein the tree structure represents a product structure of the digital mockup.

6. The method of claim 1,
wherein the identification number further comprises addressing information of the position of the product data elements in the meta structure and the geometry structure.

7. The method of claim 6,
wherein the addressing information of the corresponding identification number is changed when adding one of the elements of the meta structure and the geometry structure.

8. The method of claim 1,
wherein another identification number is added when adding one of the elements of the meta data elements and the geometry data elements.

9. The method of claim 1,
wherein the geometry data elements are selected from the group consisting of positional data, geometric data, geometric dimensions, digital mockup-data files, and CAD-data.

10. The method of claim 1,
wherein the meta data elements are selected from the group consisting of time data, version data, development status data, component number data, positional data, geometric data, geometric dimensions, digital mockup-data files, and CAD-data.

11. The method of claim 1, furthermore comprising:
dividing the meta structure and the geometry structure over a multitude of processors.

12. The method of claim 11;
wherein the multitude of processors substantially executes processes simultaneously.

13. The method of claim 1, further comprising processing the geometry data elements to filter out all information that does not serve for visualizing the product data element.

14. The method of claim 13 further comprising simplifying the processed geometry data elements.

15. The method of claim 14, wherein the simplifying comprises changing the resolution of the triangles of a 3-dimensional triangular illustration.

16. A device for improving the performance in developing an interprocess digital mockup, with at least one processor programmed to:
import a plurality of product data elements from a digital mockup;
wherein each of the plurality of product data elements contains at least one geometry data element and at least one meta data element;
address and assign each of the geometry data elements to a geometry structure, wherein a geometry in the geometry structure is combined such that a graduation of the geometry structure is reduced;
address and assign each of the meta data elements to a meta structure;
address each of the geometry data elements also in the meta structure such that the each of the plurality of product data elements is addressed and assigned in the meta structure;
wherein each product data element has a universally unique identification number such that the geometry data elements and the meta data elements of a product data element have the same universally unique identification number for providing a definite communication;
link the geometry structure and the meta structure by a communication protocol such that bidirectional interaction between the geometry structure and the meta structure is realized;
select one of the geometry data elements in the meta structure;
forward the selection to the geometric structure by the communication protocol; and
illustrate and process the selection to the geometry data element in an image processing device.

17. A non-transitory machine-readable storage medium, in which a program for improving the performance in developing an interprocess digital mockup is stored, wherein said program processes the following steps when it is executed by at least one processor:
importing a plurality of product data elements from a digital mockup;
wherein each of the plurality of product data elements contains at least one geometry data element and at least one meta data element;
addressing and assigning each of the geometry data elements to a geometry structure, wherein a geometry in the geometry structure is combined such that the graduation of the geometry structure is reduced;
addressing and assigning each of the meta data elements to a meta structure;
addressing each of the plurality of geometry data elements also in the meta structure such that each of the plurality of product data elements is addressed and assigned in the meta structure;
wherein each product data element has a universally unique identification number such that the geometry data elements and the meta data elements of a product data element have the same universally unique identification number for providing a definite communication;
linking the geometry structure and the meta structure by a communication protocol such that bidirectional interaction between the geometry structure and the meta structure is realized;
selecting one of the geometry data elements in the meta structure;
forwarding the selection to the geometric structure by the communication protocol; and
illustrating and processing the selection to the geometry data element in an image processing device.

* * * * *